United States Patent
Feilen

(10) Patent No.: US 11,271,607 B2
(45) Date of Patent: Mar. 8, 2022

(54) TEST SYSTEM AND METHOD FOR TESTING A TRANSMISSION PATH OF A CABLE CONNECTION BETWEEN A FIRST AND A SECOND POSITION

(71) Applicant: Rohde & Schwarz GmbH & Co. KG, Munich (DE)

(72) Inventor: Michael Feilen, Hoehenkirchen-Siegertsbrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 293 days.

(21) Appl. No.: 16/675,685

(22) Filed: Nov. 6, 2019

(65) Prior Publication Data
US 2021/0135709 A1 May 6, 2021

(51) Int. Cl.
| H04B 3/493 | (2015.01) |
| G01R 31/58 | (2020.01) |
| H04B 3/48 | (2015.01) |

(52) U.S. Cl.
CPC ............. *H04B 3/493* (2015.01); *G01R 31/58* (2020.01); *H04B 3/48* (2013.01)

(58) Field of Classification Search
CPC .................................. H04B 3/493; G01R 31/58
See application file for complete search history.

(56) References Cited

U.S. PATENT DOCUMENTS

| 5,793,864 A * | 8/1998 | Ramsden | H04M 3/323 |
| | | | 379/24 |
| 6,002,722 A | 12/1999 | Wu | |
| 6,055,268 A | 4/2000 | Timm et al. | |
| 6,108,430 A | 8/2000 | Kurisu | |
| 6,229,481 B1 | 5/2001 | Katz | |
| 6,570,394 B1 | 5/2003 | Williams | |
| 7,734,054 B2 | 6/2010 | Asada | |
| 8,948,326 B2 | 2/2015 | Primo et al. | |
| 9,094,943 B2 | 7/2015 | Klingenbrunn et al. | |
| 9,215,542 B2 | 12/2015 | Silzle et al. | |
| 9,661,432 B2 | 5/2017 | Silzle et al. | |
| 9,667,803 B2 | 5/2017 | Lashkari et al. | |
| 9,696,361 B1 | 7/2017 | Sun et al. | |
| 9,923,685 B2 | 3/2018 | Wild et al. | |
| 10,530,300 B2 | 1/2020 | Tröger et al. | |
| 10,581,641 B2 | 3/2020 | Nickel | |
| 2003/0083035 A1 | 5/2003 | Staszewski et al. | |

(Continued)

FOREIGN PATENT DOCUMENTS

| CA | 2873677 C | 8/2017 |
| CN | 104237942 B | 6/2019 |

(Continued)

*Primary Examiner* — Jeff W Natalini
(74) *Attorney, Agent, or Firm* — Westman, Champlin & Koehler, P.A.

(57) ABSTRACT

A testing of a transmission path of a cable connection between a first position and a second position is provided. Test signals are transmitted via the transmission path, and a transfer function is determined by evaluating the test signals. In order to assess the properties of the transmission path, the transfer function is transformed to an impulse response and the echo power of the transmission path is evaluated by analyzing the impulse response.

22 Claims, 3 Drawing Sheets

(56) References Cited

U.S. PATENT DOCUMENTS

| | | | |
|---|---|---|---|
| 2006/0251221 A1* | 11/2006 | Rosenberg | H04M 3/304 |
| | | | 379/22.01 |
| 2006/0262940 A1 | 11/2006 | Asada | |
| 2007/0132865 A1 | 6/2007 | Adams, Jr. et al. | |
| 2008/0192843 A1 | 8/2008 | Tenny et al. | |
| 2008/0281602 A1 | 11/2008 | Van Schijndel et al. | |
| 2010/0074109 A1 | 3/2010 | Klingenbrunn et al. | |
| 2012/0069883 A1* | 3/2012 | Fertner | H04B 3/46 |
| | | | 375/222 |
| 2012/0106763 A1 | 5/2012 | Okimoto et al. | |
| 2013/0058492 A1 | 3/2013 | Silzle et al. | |
| 2014/0270018 A1 | 9/2014 | Primo et al. | |
| 2014/0369166 A1 | 12/2014 | McDavid | |
| 2015/0180596 A1* | 6/2015 | Berg | H04B 17/30 |
| | | | 375/224 |
| 2015/0295734 A1 | 10/2015 | Nickel | |
| 2016/0087769 A1 | 3/2016 | Wild et al. | |
| 2016/0109387 A1 | 4/2016 | Pan | |
| 2016/0150336 A1 | 5/2016 | Silzle et al. | |
| 2017/0078489 A1 | 3/2017 | Lashkari et al. | |
| 2019/0052227 A1 | 2/2019 | Tröger et al. | |

FOREIGN PATENT DOCUMENTS

| | | |
|---|---|---|
| DE | 102012220488 A1 | 5/2014 |
| DE | 102018120958 A1 | 2/2019 |
| EP | 806852 A3 | 4/2000 |
| EP | 820168 A3 | 4/2000 |
| EP | 2804329 A1 | 11/2014 |
| EP | 2779435 B1 | 9/2015 |
| FI | 943803 A | 2/1996 |
| GB | 2542210 A | 3/2017 |
| JP | H11220797 A | 8/1999 |
| JP | 2007156393 A | 6/2007 |
| KR | 20060110769 A | 10/2006 |
| WO | 1998054851 A3 | 3/1999 |
| WO | 2005122640 A1 | 12/2005 |
| WO | 2010033872 A3 | 5/2010 |
| WO | 2017148705 A1 | 9/2017 |

\* cited by examiner

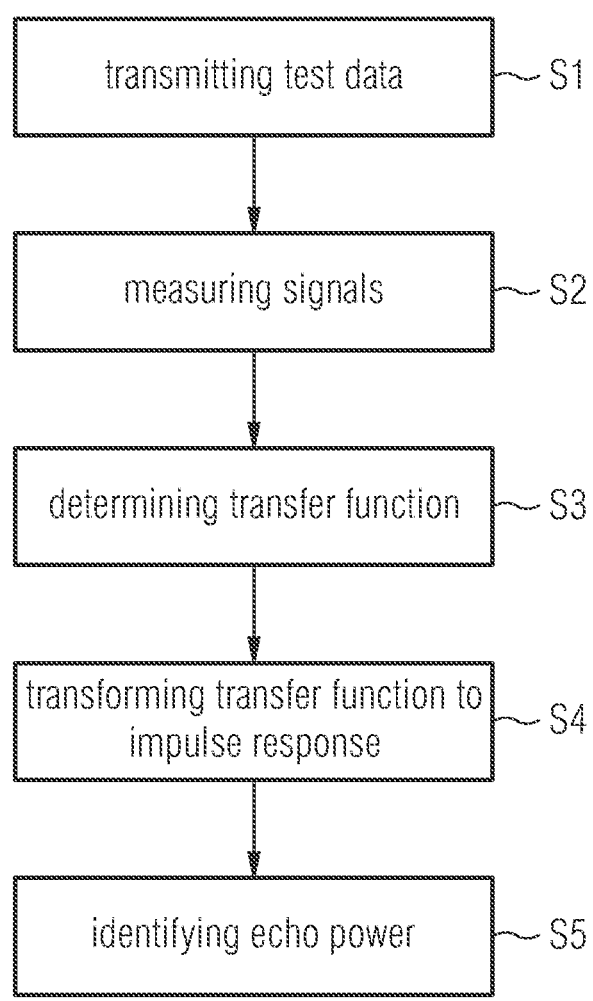

TEST SYSTEM AND METHOD FOR TESTING A TRANSMISSION PATH OF A CABLE CONNECTION BETWEEN A FIRST AND A SECOND POSITION

TECHNICAL FIELD

The present invention relates to a test system. The present invention further relates to a test method. In particular, the present invention relates to testing a transmission path of a cable connection.

BACKGROUND

Although applicable in principle to any wired test system, the present invention and its underlying problem will be hereinafter described in combination with a radio communication tester with a remote radio head.

In a radio frequency test setup, for instance a 5G test setup, cable connections may be used for connecting devices. For example, a radio communication tester may comprise a remote radio head, which is connected to a test device by a number of one or more cables. The cables and the related connectors may have defects resulting in higher reflections or attenuations. In such a case, a required performance of the test setup can no longer be guaranteed.

In order to identify a defect or an improper connection of a cable to a connector, a user may visually inspect the cables of the test arrangement. However, such a manual inspection by a user is time-consuming. Nevertheless, a user may overlook some defects. Furthermore, it may be even possible that a defect of a cable or an improper connection may be not visible, and thus, such defect cannot be recognized by the user.

Against this background, a problem addressed by the present invention is to provide a reliable inspection of a cable connection of a test setup. Furthermore, the present invention aims to provide testing of a cable connection, which can be performed in an automated manner.

SUMMARY

The present invention solves this problem with a test system and a test method with the features of the independent claims. Further advantageous embodiments are subject-matter of the dependent claims.

According to a first aspect, a test system for testing a transmission path of a cable connection is provided. The transmission path may relate to a cable connection between a first position and a second position. The test system comprises a signal generator, a measurement device, an analyzing device, a transformation device and a processing device. The signal generator is configured to generate a number of one or more test signals. The signal generator may be further configured to transmit the generated test signals via the transmission path from the first position to the second position. The measuring device is configured to measure signals at the second position. In particular, the measuring device may measure signals relating to the transmitted test signals at the second position. The analyzing device is configured to determine a transfer function of the transmission path. The transfer function may be determined based on the measured signals at the second position. The transformation device is configured to transform the transfer function to an impulse response of the transmission path. The processing device is configured to identify relative echo power in the transmission path. The relative echo power may be identified based on the impulse response.

According to a second aspect, a test method is provided. The test method may be used for testing a transmission path of a cable connection between a first position and a second position. The test method comprises a step of transmitting a number of one or more test signals via the transmission path from the first position to the second position. The transmission may be performed by a signal generator, which may generate the test signals. The method further comprises a step of measuring signals at the second position. The measured signals may relate to the transmitted test signals. The measuring may be performed by a measuring device. Further, the method may comprise a step of determining a transfer function of the transmission path based on the measured signals. The determination of the transfer function may be performed by an analyzing device. The method may further comprise a step of transforming the transfer function to an impulse response of the transmission path. The transformation may be performed by a transformation device. Furthermore, the method may comprise a step of identifying relative echo power in a transmission path based on the impulse response. The identification of the relative echo power may be performed by a processing device.

The present invention is based on the fact that a defect in a cable connection or an improper connection of a cable to a connector may cause disturbances in a test operation using a test setup with an improper cable connection. For example, a defect in a cable or a connector, or an improper connection of a cable to a connector may cause reflections or attenuations. However, recognizing such failures by visual inspection is time-consuming. Furthermore, some defects may be even not visible by a manual inspection.

The present invention therefore aims to provide testing of a cable connection, which can be performed in an automated manner. In particular, the present invention aims to provide testing of cable connections which can be evaluated objectively. Accordingly, it is possible provide a reliable evaluation of the cable connection, which can be used for assessing whether or not the cable connection fulfills desired requirements. In this way, it can be ensured that the test setup with the related cable connections is within desired limits, and the test is not disturbed due to an improper connection.

The cable connection may be any kind of cable connection which can be used for transmitting electronic signals, in particular radio frequency signals. For example, the cable connection may be a coaxial cable connection or the like. The cable used for such a cable connection may have appropriate connectors for connecting the cable with corresponding terminals of a test device or device under test. For this purpose, any kind of appropriate connector may be used.

The signal generator may be any kind of appropriate generator for generating the desired test signals. For example, the signal generator may generate test signals having predetermined characteristics with respect to frequency, amplitude, signal strength etc. For example, the signal generator may comprise a digital-to-analogue converter. Such a digital-to-analogue converter may provide analogue test signals based on related digital data. The signal generator may comprise any other appropriate components such as, for example, a tunable frequency generator, mixer or the like. Furthermore, the signal generator may comprise an amplifier and/or attenuator for adapting the amplitude or signal strength of the test signals. The signals generated by the signal generator transmitted through the cable connection from the first position to the second position may be any kind of test signals, which are appropriate for determining a transfer function of the signal path provided by the cable connection. For example, the test signal may comprise a sequence of multiple signals, each signal being a continuous wave signal with a specific frequency. Accordingly, by providing test signals with multiple different frequencies, it may be possible to determine a transfer function of the transmission path. However, any other kind of test signals may be also possible. For example, the test signals may comprise a frequency sweep over a specific frequency range.

The measuring device measures a signal strength at the second position, i. e. the opposite end of the transmission path. In this way, the measuring device may measure the result of the test signals provided by the signal generator after the test signals have passed the transmission path. In this way, it is possible to evaluate the impact of the transmission path, for example to evaluate attenuations or reflections in the transmission path between the first position and the second position. The measuring device may be any kind of device for measuring electronic signals, in particular radio frequency signals. For this purpose, the measuring device may comprise elements such as amplifiers, attenuators, mixers, rectifiers, filters or the like. In particular, the measuring device may be appropriate for measuring a signal strength, in particular a power of signals received at the second position.

The analyzing device may obtain the results of the measuring device and evaluate the measured signals in order to determine a transfer function of the transmission path. For this purpose, the analyzing device may obtain measurement results relating to multiple different frequencies and analyze the respective measurement results with respect to the corresponding frequencies. In particular, the analyzing device may receive the results of the measuring device in an analogue form and convert the measurement results to digital date. Alternatively, the measuring device may already comprise an analogue-to-digital converter and provide the measurement results in digital form to the analyzing device.

The transformation device may perform a transformation of the transfer function to an impulse response. Such transformation from the transfer function to the impulse response may be performed, for example, by a Fourier transform.

The processing device may obtain the impulse response provided by the transformation device and analyze the impulse response in order to identify relative echo power in the transmission path. For example, the processing device may analyze the impulse response in order to identify one or more peaks in the impulse response. The identified peaks may relate to reflections in a transmission path. Accordingly, the identified peaks may be set in relationship to a main peak in order to identify the relative echo power.

The individual devices of the test system, in particular the analyzing device, the transformation device and the processing device may be implemented by a software, at least in part. For this purpose, one or more processor may be provided with corresponding instructions. The instructions may be stored, for example, in a memory, which is communicatively coupled with the respective processor. The processor may further execute an operating system that loads and executes the respective instructions. The processor may be, for example, an Intel processor that runs an operating system that loads and executes the instructions. Alternatively, the processor may run an embedded operating system that loads and executes the instructions.

Further embodiments of the present invention are subject of the further subclaims and of the following description, referring to the drawings.

In a possible embodiment, the processing device may be configured to compare the identified echo power with predetermined limits. If the identified echo power exceeds at least one predetermined limit, the processing device may generate a message.

The limits may be any kind of limits for specifying desired constraints. For example, the limits may specify requirements for the quality of the transmission path provided by the cable connection, which have to be fulfilled for a desired test procedure. Accordingly, by identifying that the desired limits are not fulfilled, i. e. the relative echo power exceeds the predetermined limit, a message may be generated. The message may be, for example, an indication which is provided to a user. For example, an optical or acoustical signal may be provided. In a possible example, a color of an indicator may change depending on the identified echo power. Alternatively, an alphanumeric message may be provided to a user on a display. For example, a number corresponding to the identified echo power may be provided to a user such that the user can recognize whether or not the requirements for desired tests are fulfilled.

In a possible embodiment, the processing device is configured to compare an absolute power of the measured signals with a predetermined threshold value.

Further to the evaluation of the cable connection based on the relative echo power, the cable connection may be assessed based on the absolute power of a test signal which is measured by the measuring device. In particular, a limit or value of tolerance may be specified in advance, and the measured power of the signal may be compared with this predefined value. In particular, the evaluation of the absolute power may be used as an additional criterion for evaluating the property/quality of the transmission path. For example, it may be required that the relative echo power as well as the measured absolute power has to fulfil specific requirements.

In a possible embodiment, the signal generator is configured to generate a number of continuous wave test signals. The individual test signals may relate to different frequencies.

By providing multiple continuous wave signals with different frequencies, it is possible to obtain appropriate measurement data for determining a transfer function of the transmission path over the frequency range covered by the test signals.

In a possible embodiment, the test signals may relate to frequencies of predetermined frequency grid. For example, the frequency grid may specify a frequency range between a lower and an upper limit. Between the lower and the upper limit of the frequency range, multiple test signals may be provided, wherein a frequency distance between two adjacent signals may be constant. In other words, the frequency grid may specify multiple frequencies between a lower and an upper limit with equidistant frequency intervals.

In a possible embodiment, the measurement device may comprise a power detector.

A power detector may detect an amount or amplitude of a signal measured by the power detector without considering a modulation or the like. In this way, a simple and efficient measuring can be achieved.

In a possible embodiment, the first position is located in a first device. Furthermore, the second position is located in a second device. The first device and the second device may be connected by a cable connection of the transmission path. In this way, a wired connection by the cable connection between the first and the second device can be evaluated by the test system.

In a possible embodiment, the first position and the second position are located in a first device. The test system may further comprise a loop back device. The loop back device is arranged in a second device. In this case, the transmission path may comprise a first cable connection from the first device to the second device, the loop back device in the second device, and a second cable connection from the second device to the first device.

Accordingly, in such a configuration the generation transmission of the test signals and the measuring of the transmitted test signals both are performed in the first device, while the test signals are looped through a second device. In this way, it is possible to evaluate two cable connections between the first and the second device in a single process.

In a possible embodiment, the first cable connection may be connected to a transmission port of the first device. The second cable connection may be connected to a reception port of the first device. Accordingly, a transmission path and a reception path between the first and the second device can be evaluated at the same time.

In a possible embodiment, the second device may be a remote radio head. Accordingly, the cable connection between a main device and a remote radio head may be evaluated.

In a possible embodiment, the test system comprises a further measuring device. The further measuring device may be arranged in the second device comprising the loop back device.

By such a configuration, it may be possible to evaluate only a single segment of the transmission path relating to one cable connection between the first device and the second device.

With the present invention it is therefore now possible to automatically analyze a cable connection of a transmission path, for example a cable connection in a test system. Accordingly, a reliable identification of defects of the cable or a connector can be identified in a reliable manner. Furthermore, improper connections of the cable to a connector may be also identified. By evaluating the properties of the cable connection and identifying distortions, the reliability of the test procedure can be improved.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which:

FIG. 4 shows a flow diagram of an embodiment of a test method according to the present invention.

Figure 1:
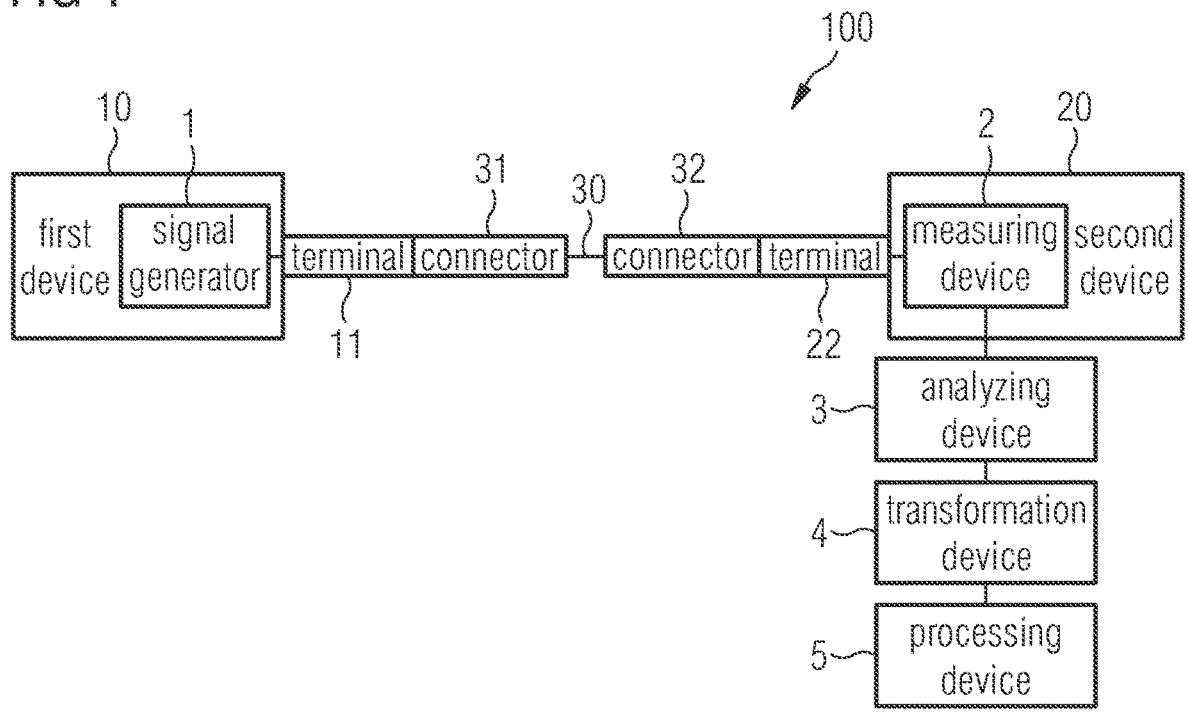
FIG. 1 shows a block diagram of an embodiment of a test system according to the present invention.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of a test system 100 according to an embodiment. The test system 100 comprises a signal generator 1, a measurement device 2, an analyzing device 3, a transformation device 4 and a processing device 5. As can be further seen in FIG. 1, the signal generator 1 may be arranged in a first device 10, and the measuring device 2 may be arranged in a second device 20. The first device 10 and the second device 20 may be coupled by a cable connection 30. For this purpose, the cable connection 30 may comprise a first connector 31, which may be connected to a terminal 11 of the first device 10. Further, the cable connection 30 may comprise a second connector 32, which is arranged at the opposite ending of the cable connection 30. The second connector 32 may be connected to a terminal 22 of the second device 20. In this way, cable connection 30 provides a transmission path between a first position, i. e. terminal 11 of the first device and a second position, i. e. the terminal 22 of the second device 20.

Signal generator 1 may generator a number of test signals. The generated test signals may be provided to the terminal 11 of the first device 10. In this way, the generated test signals may be transmitted via the transmission path of the cable connection 30 to the terminal 22 of the second device 20. Accordingly, measuring device 2 may measure signals received at the terminal 22 of the second device 20. The received signals may be forwarded to analyzing device 3 for further analysis as will be described in more detail below.

Signal generator 1 may generate a number of one or more test signals, which may be transmitted via the transmission path provided by a cable connection 30 from the first device to the second device 20. In particular, signal generator 1 may generate multiple continuous wave signals. The multiple continuous wave signals may have different frequencies. For example, the frequency of each test signal of the sequence of test signals may be increased or decreased by a predetermined frequency offset. It may be also possible to generate more than one test signal having a same frequency and increase or decrease the frequency after generating and transmitting a predetermined number of test signals having a same frequency. However, it is understood, that the frequency of the test signals may be also changed according to any other appropriate manner. It may be also possible to generate one or more test signals with a frequency sweep over a frequency range from a first frequency to a second frequency. Any other manner for testing the transmission channel between the first device 10 and the second device 20 may be also possible.

The signal generator 1 may be any kind of appropriate signal generator for generating the desired test signals. For example, the signal generator 1 may comprise a tunable frequency generator. Furthermore, signal generator 1 may comprise a digital-to-analogue converter. Accordingly, digital signals may be provided to the digital-to-analogue converter, which are converted to analogue signals in order to provide the desired test signals. Furthermore, signal generator 1 may comprise any other component, for example filters, mixers, or devices such as amplifiers or attenuators for adapting the amplitude or signal strength of the generated test signals.

First device 10 may be, for example, a test device for testing a device under test. For this purpose, the first device 10 may generate appropriate signals, which may be applied to the device under test via the transmission path provided by the cable connection 30 and the second device 20. In such a case, the test signals may be generated, for example, by a signal generator, which is already implemented in the first device 10.

Measuring device 2 measures the signals received in the second device 20, in particular the signals received in the second device 20 via the cable connection 30 from the signal generator 1 of the first device 10. For example, measuring device 2 may measure a power level or a signal strength of the signals received in the second device 20. For this purpose, measuring device 2 may comprise a power sensor or the like. However, it is understood that any other approach for measuring signals may be also possible. Even though, it may be sufficient to measure a power level or a signal strength of the signals received in the second device 20, measuring device 2 may also perform a more detailed measurement. For instance, measuring device 2 may measure a phase, a modulation or any other characteristic parameter of the received signals. Measuring device 2 may comprise an analogue-to-digital converter for converting the analogue received signals to digital data. Alternatively, it may be also possible to forward the measured signals to analyzing device 3 in an analogue form. In this case, an analogue-to-digital conversion may be performed in analyzing device 3.

The measured signals are forwarded from the measuring device 2 to the analyzing device 3, and analyzing device 3 determines a transfer function of the transmission path between the signal generator 1 in the first device and the measuring device 2 in the second device 20. For this purpose, analyzing device 3 may analyze the measured signals over a desired frequency range. For example, analyzing device 3 may compute for each frequency a ratio between the test signal transmitted by a signal generator 1 and the corresponding signal received by measuring device 2. In case that the test signals are generated and transmitted by known, well-defined parameters such as frequency and amplitude, analyzing device 3 may take into account these well-defined parameters and compare the corresponding measured signals with these parameters. Alternatively, the respective parameters of the generated signals may be also provided from signal generator 1 to analyzing device 3. In this way, analyzing device 3 may determine a transfer function of the transmission path provided by the cable connection 30 in a specific frequency range.

The determined transfer function is transformed to an impulse response by transformation device 4. This transformation may be performed, for example, by a Fourier transform. In order to achieve an efficient and fast transformation, a fast Fourier transform (FFT) may be applied.

The result of the transformation of the transfer function, i. e. the impulse response of the transmission path may be used by processing device 5 for analysis of the transmission path and in particular of the quality of the cable connection 30. For this purpose, processing device may identify a relative echo power in the transmission path by analyzing the impulse response. Processing device 5 may determine an amplitude of a peak relating to the zero point of the impulse response. Furthermore, processing device 5 may identify further peaks in the impulse response. The amplitude of the further peaks in the impulse response may be set in relation to the amplitude of the peak at the zero point. The further peaks in the impulse response may relate to echoes at a connection point, for example a connection between a connector 31 or 32 with the corresponding terminal 11 or 22. Furthermore, defects in the cable connection 30 may also cause reflections or attenuations, which lead to additional peaks in the transfer function. Thus, by analyzing the additional peaks in the transfer function, the quality, and in particular improper connections or defects in the cable connection can be identified and evaluated.

For example, processing device 5 may compare the identified relative echo power in the impulse response with one or more predetermined limits. If at least of these limits is not fulfilled, processing device 5 may issue a corresponding message. For example, a signaling may be provided if the predetermined limits are not fulfilled. In a possible example, an error may be indicated by an acoustical signal, for example a beep, or an optical signal, for example, by a lamp or a message on a display.

In particular, processing device 5 may comprise a display for providing the impulse response and/or the result of the analysis of the impulse response. By displaying the impulse response to a user, the user can easily recognize the type of an issue, which is responsible that the desired limits are not be fulfilled. In order to further help the user recognizing the location of a defect in the cable connection, processing device 5 may indicate in the display of the transfer function the position of an echo, which is responsible that the desired limits are not fulfilled. However, it is understood, that any other manner for providing the results of the analysis to a user may be also possible.

Furthermore, the absolute power of the test signals may also be taken into account. For example, measuring device 2 may measure a power level and provide a signal corresponding to the measured power to processing device 5. Alternatively, the power of the measured signal may be determined in any other manner. For example, processing device 5 may compute an absolute power of the measured signal based on measurement data or signals provided by measuring device 2. Accordingly, processing device 5 may compare the absolute power of the signals measured by measuring device 2 with a predetermined threshold value or value of tolerance. Thus, the threshold value or value of tolerance may specify a limit. If the absolute power is below this limit, processing device 5 may issue a corresponding message. In particular, this message may be provided similar to the message as already described above in connection with the analysis of the relative echo power. Accordingly, the evaluation of the cable connection 30 may be performed by considering both, the relative echo power and the absolute power.

Figure 2:
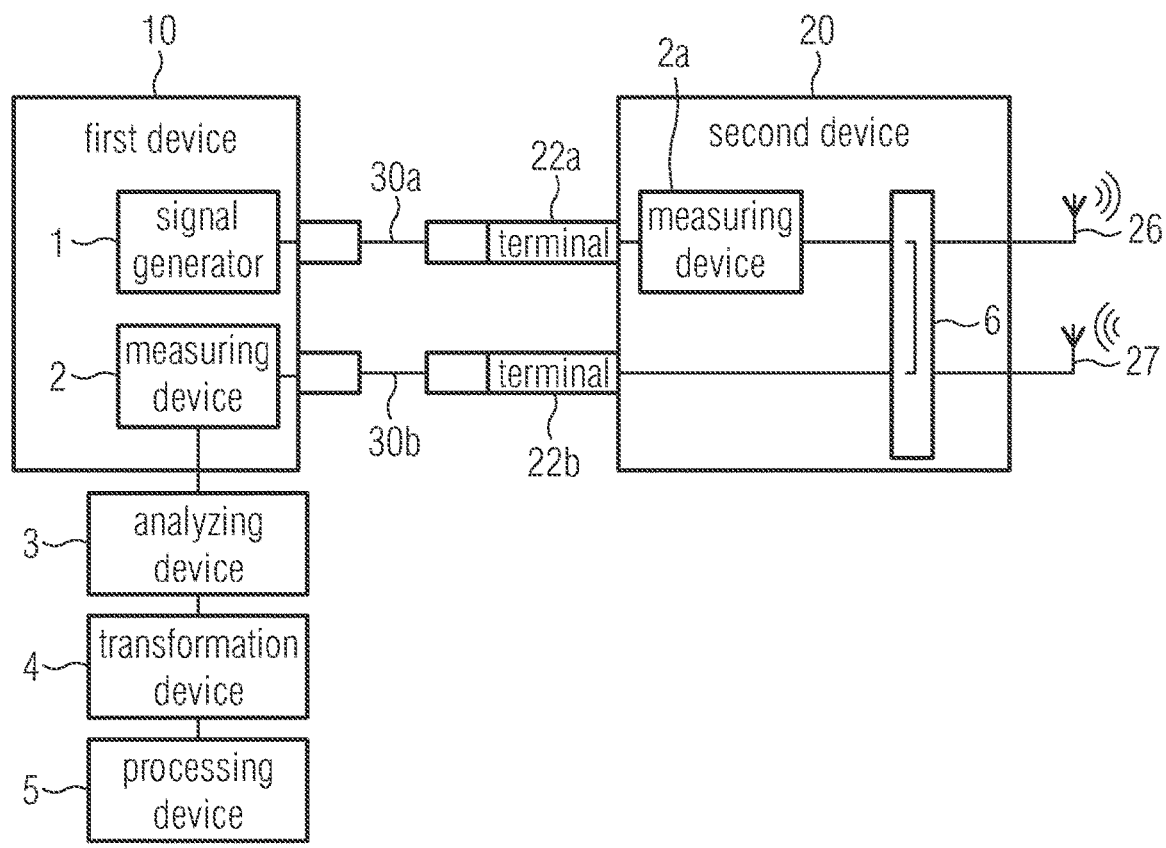
FIG. 2 shows a block diagram of another embodiment of a test system according to the present invention.

FIG. 2 shows a block diagram of a test system 200 according to a further embodiment. The test system 200 according to FIG. 2 mainly differs from the previous described embodiment in that the signal generator as well as the measuring device are arranged in the first device 10. The first device 10 and the second device 20 are connected by at least two cable connections 30a and 30b. For example, a first cable connection 30a may be used as a transmission path for transmitting signals from the first device 10 to the second device 20. A second cable connection 30b may be used as a receiving path for receiving signals from the second device 20 by the first device 10. For example, the first device 10 may generate transmission signals, which are transmitted to second device 20 via the first cable connection 30a, and the transmission signals are emitted by a first antenna 25. Furthermore, a second antenna 26 of the second device 20 may receive radio frequency signals and forward the received radio frequency signals via the second cable connection 30b to the first device 10. For example, the arrangement according to FIG. 2 may be a radio communication tester such as R&S CMP 200 radio communication tester. In particular, the second device may be a remote radio head (RRH) of the radio communication tester.

In order to evaluate the transmission path comprising the first cable connection 30a and the second cable connection 30b, a loop back device 6 may be arranged in the second device 20. Accordingly, signal generator 1 may transmit test signals from the first device 10 via the first cable connection 30a to the second device 20. Loop back device 6 may forward the signals obtained at a first terminal 22a of the second device 20 to a second terminal 22b of the second device 20. Further, the second terminal 22b may be connected with a second terminal 11b of the first device 10 via the second cable connection 30b. In this way, measuring device 2 in the first device 10 can receive signals relating to the test signals provided by signal generator 1, which are transmitted via the first cable connection 30a, the loop back device 6 and the second cable connection 30b. In this way, both, the transmission path with the first cable connection 30a and the receiving path with the second cable connection 30b may be tested by a single test procedure. In particular, the testing of the transmission path with the first cable connection 30a and the second cable connection 30b may be performed as already described above in connection with FIG. 1.

Optionally, a further measuring device 2a may be arranged in the second device 20. In this way, it is possible to evaluate the transmission characteristics of a single cable connection 30a (or 30b). For this purpose, the further measuring device 2a may be communicatively coupled with analyzing device 3. Alternatively, it may be also possible to provide a further analyzing device, a further transformation device and/or a further processing device for evaluating the results of the further measuring device 2a.

Figure 3:
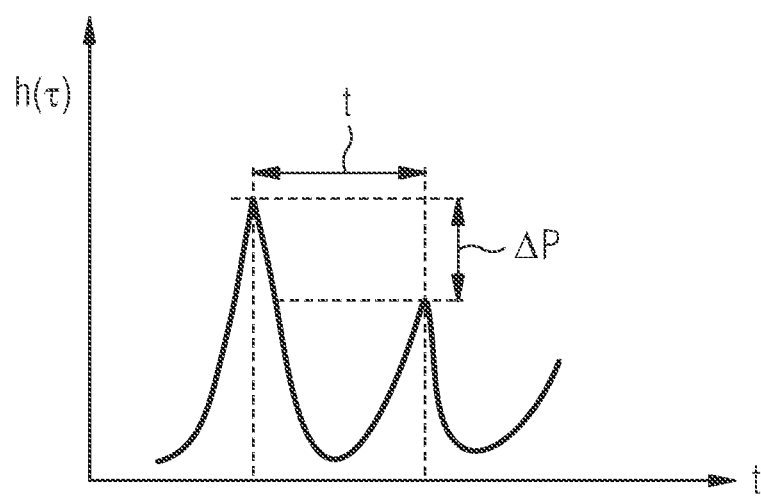
FIG. 3 shows an example of an impulse response determined by a test system according to an embodiment of the present invention.

FIG. 3 shows an example illustrating a transfer function h. As can be seen in this example, transfer function h has a main peak at the zero point 0. Additional peaks in the transfer function h may be caused, for example, due to reflections at the connectors/terminals of the cable connection between the first device 10 and the second device 20. Thus, a distance t between the main peak and the next peak may correspond to a propagation delay through the cable connection 30. Accordingly, processing device 5 may evaluate a relative echo power ΔP between the amplitude of the main peak and a further peak. This relative echo power may be compared with predetermined limits in order to evaluate whether or not the requirements for performing a test procedure is fulfilled.

For sake of clarity in the following description of the method based FIG. 4 the reference signs used above in the description of apparatus based FIGS. 1-3 will be maintained.

FIG. 4 shows a flow diagram of a test method according to an embodiment.

The test method may be applied for testing a transmission path of a cable connection 30 between a first position and a second position. The test method comprises a step S1 of transmitting a number of test signals via the transmission path from the first position to the second position. The transmission of the test signals may be performed, for example, by a signal generator 1. In step S2, signals relating to the transmitted test signals are measured at the second position. The measuring of the signals may be performed, for example, by measuring device 2.

In step S3, a transfer function of the transmission path may be determined. The transfer function may be determined based on the measured signals. In particular, the determination of the transfer function may be performed by an analyzing device 3.

In step S4, the transfer function is transformed to an impulse response of the transmission path. The transformation may be performed, for example, by a transformation device 4. In particular, a Fourier transform, for example a fast Fourier transform may be applied for transforming the transfer function to the impulse response.

In step S5, relative echo powers in the transmission path are identified. In particular, the relative echo power is determined based on the impulse response. For example, the identification of the relative echo powers may be performed by a processing device 5.

The identified echo power may be compared with predetermined limits. A message may be generated, if the identified echo power exceeds at least one predetermined limit.

Furthermore, an absolute power of the measured signals may be compared with a predetermined threshold value. The comparing may be performed by processing device 2.

The test signals may comprise a number of continuous wave test signals. The number of continuous wave test signals may have different frequencies. In particular, the frequencies of the test signals may relate to a predetermined frequency grid. For example, the difference of the frequency between the test signals may have a constant offset.

The measuring of the signals relating to the transmitted test signals in step S2 may be performed by a power detector.

The first position may be located in a first device 10. The second position may be located in a second device 20. The first device 10 and the second device 20 may be connected by a cable connection 30 of the transmission path.

Alternatively, the first position and the second position may be located in a first device 10. In this case, the transmission path may comprise a first cable connection 30a from the first device 10 to the second device 20, a loop back device 6 arranged in the second device 20 and a second cable connection 30b from the second device 20 to the first device 10. In this case, an optional further measuring device 2a may be provided in the second device for measuring the signals relating to the transmitted test signals.

The first cable connection may be connected to a transmission port of the first device 10 and the second cable connection may be connected to a reception port of the first device 10.

As already described above, the second device 20 may be a remote radio head of a radio communication tester.

Summarizing, the present invention relates to testing of a transmission path of a cable connection between a first position and a second position. Test signals are transmitted via the transmission path, and a transfer function is determined by evaluating the test signals. In order to assess the properties of the transmission path, the transfer function is transformed to an impulse response and the echo power of the transmission path is evaluated by analyzing the impulse response.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention.

However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A test system for testing a transmission path of a cable connection between a first position and a second position, the test system comprising:
    a signal generator for generating a number of test signals and transmitting the generated test signals via the transmission path from the first position to the second position;
    a measuring device for measuring signals relating to the transmitted test signals at the second position;
    an analyzing device for determining a transfer function of the transmission path based on the measured signals;
    a transformation device for transforming the transfer function to an impulse response of the transmission path; and
    a processing device for identifying relative echo power in the transmission path based on the impulse response.

2. The test system of claim 1, wherein the processing device is configured to compare the identified echo power with predetermined limits and generate a message if the identified echo power exceeds at least one predetermined limit.

3. The test system of claim 2, wherein the processing device is configured to compare an absolute power of the measured signals with a predetermined threshold value.

4. The test system of claim 1, wherein the signal generator is configured to generate a number of continuous wave test signals, and wherein the test signals relate to different frequencies.

5. The test system of claim 4, wherein the test signals relate to frequencies of a predetermined frequency grid.

6. The test system of claim 1, wherein the measuring device comprises a power detector.

7. The test system of claim 1, wherein the first position is located in a first device, the second position is located in a second device, and the first device and the second device are connected with each other by the cable connection of the transmission path.

8. The test system of claim 1, wherein the first position and the second position are located in a first device,
    the test system comprises a loop back device arranged in a second device, and
    wherein the transmission path comprises a first cable connection from the first device to the second device, the loop back device and a second cable connection from the second device to the first device.

9. The test system of claim 8, comprising a further measuring device for measuring signals relating to the transmitted test signals in the second device.

10. The test system of claim 8, wherein the first cable connection is connected to a transmission port of the first device and the second cable connection is connected to a reception port of the first device.

11. The test system of claim 10, wherein the second device is a remote radio head.

12. A test method for testing a transmission path of a cable connection between a first position and a second position, the test method comprising:
    transmitting, by a signal generator, a number of test signals via the transmission path from the first position to the second position;
    measuring, by a measuring device, signals relating to the transmitted test signals at the second position;
    determining, by an analyzing device, a transfer function of the transmission path based on the measured signals;
    transforming, by a transformation device, the transfer function to an impulse response of the transmission path; and
    identifying, by a processing device, relative echo power in the transmission path based on the impulse response.

13. The test method of claim 12, comprising comparing, by the processing device, the identified echo power with predetermined limits and generating a message if the identified echo power exceeds at least one predetermined limit.

14. The test method of claim 13, comprising comparing, by the processing device, an absolute power of the measured signals with a predetermined threshold value.

15. The test method of claim 12, wherein the test signal comprise a number of continuous wave test signals relating to different frequencies.

16. The test method of claim 15, wherein the test signals relate to frequencies of a predetermined frequency grid.

17. The test method of claim 12, wherein the signals which relate to the transmitted test signals are measured by a power detector.

18. The test method of claim 12, wherein the first position is located in a first device, the second position is located in a second device, and the first device and the second device are connected by the cable connection of the transmission path.

19. The test method of claim 12, wherein the first position and the second position are located in a first device, and
    wherein the transmission path comprises a first cable connection from the first device to a second device, a loop back device arranged in the second device, and a second cable connection from the second device to the first device.

20. The test method of claim 19, comprising measuring, by a further measuring device in the second device, signals relating to the transmitted test signals.

21. The test method of claim 19, wherein the first cable connection is connected to a transmission port of the first device and the second cable connection is connected to a reception port of the first device.

22. The test method of claim 21, wherein the second device is a remote radio head.

* * * * *